(12) United States Patent
Mascarenhas

(10) Patent No.: US 9,076,915 B2
(45) Date of Patent: Jul. 7, 2015

(54) BORON, BISMUTH CO-DOPING OF GALLIUM ARSENIDE AND OTHER COMPOUNDS FOR PHOTONIC AND HETEROJUNCTION BIPOLAR TRANSISTOR DEVICES

(75) Inventor: Angelo Mascarenhas, Golden, CO (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 60 days.

(21) Appl. No.: 13/877,092

(22) PCT Filed: Mar. 8, 2011

(86) PCT No.: PCT/US2011/027593
§ 371 (c)(1),
(2), (4) Date: Aug. 16, 2013

(87) PCT Pub. No.: WO2011/112612
PCT Pub. Date: Sep. 15, 2011

(65) Prior Publication Data
US 2013/0327380 A1 Dec. 12, 2013

Related U.S. Application Data

(60) Provisional application No. 61/311,513, filed on Mar. 8, 2010.

(51) Int. Cl.
*H01L 31/0725* (2012.01)
*H01L 29/66* (2006.01)
*H01L 31/0304* (2006.01)
*H01L 31/0687* (2012.01)
(Continued)

(52) U.S. Cl.
CPC ...... *H01L 31/0725* (2013.01); *H01L 29/66318* (2013.01); *H01L 31/03042* (2013.01); *H01L 31/06875* (2013.01); *H01L 29/207* (2013.01); *Y02E 10/544* (2013.01); *H01L 29/737* (2013.01)

(58) Field of Classification Search
CPC ... H01L 31/00; H01L 31/068; H01L 31/0687; H01L 31/0693; H01L 31/0248; H01L 31/0304; H01L 31/03042; H01L 31/03046; H01L 31/0256; H01L 31/03044; H01L 31/06; H01L 31/072; H01L 31/0725; H01L 31/0735
See application file for complete search history.

(56) References Cited

U.S. PATENT DOCUMENTS 4,284,962 A 8/1981 Esterowitz et al.
4,400,221 A 8/1983 Rahilly
(Continued)

OTHER PUBLICATIONS

Brandt et al., "High p-type conductivity in cubic GaN/GaAs(113)A by using Be as the acceptor and O as the codopant", Applied Physics Letters, Oct. 1996, vol. 69, No. 18, pp. 2707-2709.
(Continued)

*Primary Examiner* — Christina Chern
(74) *Attorney, Agent, or Firm* — J. Patrick Kendrick; W. LaNelle Owens; Michael A. McIntyre

(57) ABSTRACT

Isoelectronic co-doping of semiconductor compounds and alloys with acceptors and deep donors is sued to decrease bandgap, to increase concentration of the dopant constituents in the resulting alloys, and to increase carrier mobilities lifetimes. For example, Group III-V compounds and alloys, such as GaAs and GaP, are isoelectronically co-doped with, for example, B and Bi, to customize solar cells, and other semiconductor devices. Isoelectronically co-doped Group II-VI compounds and alloys are also included.

10 Claims, 4 Drawing Sheets

(51) Int. Cl.
    H01L 29/207    (2006.01)
    H01L 29/737    (2006.01)

(56)  References Cited

U.S. PATENT DOCUMENTS

| | | | |
|---|---|---|---|
| 4,591,654 | A | 5/1986 | Yamaguchi et al. |
| 4,939,103 | A | 7/1990 | Szolgyemy |
| 5,028,561 | A | 7/1991 | Kamath et al. |
| 5,116,455 | A | 5/1992 | Daly |
| 5,158,896 | A | 10/1992 | Burroughes et al. |
| 5,231,298 | A | 7/1993 | Daly |
| 5,344,791 | A | 9/1994 | Huang |
| 5,387,544 | A | 2/1995 | Hayafuji |
| 5,422,731 | A | 6/1995 | Beneking |
| 5,453,404 | A | 9/1995 | Leedy |
| 5,728,231 | A | 3/1998 | Negami et al. |
| 5,776,793 | A | 7/1998 | Lee et al. |
| 5,895,225 | A | 4/1999 | Kidoguchi et al. |
| 5,944,913 | A * | 8/1999 | Hou et al. ............ 136/255 |
| 5,963,571 | A | 10/1999 | Wingreen |
| 5,986,288 | A | 11/1999 | Hasegawa |
| 6,002,202 | A | 12/1999 | Meyer et al. |
| 6,426,522 | B1 | 7/2002 | Kean et al. |
| 6,653,248 | B2 | 11/2003 | Kean et al. |
| 6,815,736 | B2 | 11/2004 | Mascarenhas |
| 6,936,871 | B2 | 8/2005 | Hase |
| 7,009,225 | B2 | 3/2006 | Hase |
| 7,067,858 | B2 | 6/2006 | Hase |
| 7,148,417 | B1 | 12/2006 | Landis |
| 7,368,765 | B1 | 5/2008 | Rajavel et al. |
| 2002/0117675 | A1 | 8/2002 | Mascarenhas |
| 2004/0056283 | A1 | 3/2004 | Yamauchi et al. |
| 2005/0263792 | A1 | 12/2005 | Hase |

OTHER PUBLICATIONS

Kini et al., "Effect of Bi alloying on the hole transport in the dilute bismide alloy GaAs1-XBiX", Physical Review B, 2011, vol. 83, pp. 075307-1-075307-6.

Kondow et al., "Extremely Large N Content (up to 10%) in GaNAs Grown by Gas-source Molecular Beam Epitaxy", Journal of Crystal Growth, Jul. 1996, vol. 164, Issues 1-4, pp. 175-179.

Kuznetsov et al., "High-temperature Luminescence of GaP:Bi:N", Soviet Physics: Semiconductors, Apr. 1980, vol. 14, No. 4, pp. 417-419.

Neugebauer et al., "Electronic Structure and Phase Stability GaAs1-xNx Alloys", Physical Review B—Condensed Matter and Materials Physics, Apr. 15, 1995, vol. 51, No. 16, pp. 10568-10571.

Nittono et al., "Carbon and Indium Codoping in GaAs for Reliable AlGaAs/GaAs Heterojunction Bipolar Transistors", Japanese Journal of Applied Physics, Nov. 1994, vol. 33, Part 1, pp. 6129-6135.

Oe et al., "New Semiconductor Alloy AgAs1-xBix Grown by Metal Organic Vapor Phase Epitaxy", Japanese Journal of Applied Physics, Nov. 1998, vol. 37, pp. L1283-L1285.

Pankove et al., "Molecular Doping of Gallium Nitride", Applied Physics Letters, Jan. 1999, vol. 74, No. 3, pp. 416-418.

Ploog et al., "Doping of group III nitrides", Journal of Vacuum Society Technology A, Aug. 1998, vol. 16, No. 3, pp. 1609-1614.

Thomas et al., "Isoelectronic Traps Due to Nitrogen in Gallium Phosphide", Physical Review, Oct. 14, 1965, vol. 150, No. 2, pp. 680-689.

Trumbore et al., "Luminescence due to the Isolectronic Substitution of Bismuth for Phosphorus in Gallium Phosphide", Applied Physics Letters, Jul. 1966, vol. 9, No. 1, pp. 4-6.

Weyers et al., "Red Shift of Photoluminescence and Absorption in Dilute GaAsN Alloy Layers", Japanese Journal of Applied Physics, Jul. 1, 1992, vol. 31, Part 2, No. 7A, pp. L853-L855.

White et al., "Ion-beam Synthesis and Stability of GaAs Nanocrystals in Silicon", Applied Physics Letters, Apr. 22, 1996, vol. 68, No. 17, pp. 2389-2391.

Withrow et al., "Beam-Solid Interactions: Physical Phenomena", Materials Research Society Symposium Proceedings, 1990, vol. 157, pp. 143-148.

Yamamoto et al., "Role of CI or I Codoping in Li-Doping Enhancement in ZnSe", Japanese Journal of Applied Physics, Aug. 1998, Part 2, No. 8A, pp. L910-L912.

Yamamoto et al., "Solution Using a Codoping Method to Unipolarity for the Fabrication of p-type ZnO", Japanese Journal of Applied Physics, Feb. 1999, vol. 38, Pt. 2, No. 2B, pp. L166-L169.

International Search Report for International (PCT) Application PCT/US11/27593, mailed on May 12, 2011, pp. 1-3.

Written Opinion for for International (PCT) Application PCT/US11/27593, mailed on May 12, 2011, pp. 1-5.

International Preliminary Report on Patentability for International (PCT) Application PCT/US11/27593, issued Sep. 11, 2012, pp. 1-7.

\* cited by examiner

BORON, BISMUTH CO-DOPING OF GALLIUM ARSENIDE AND OTHER COMPOUNDS FOR PHOTONIC AND HETEROJUNCTION BIPOLAR TRANSISTOR DEVICES

CROSS-REFERENCE TO RELATED PATENT APPLICATION

The present non-provisional utility application claims priority under 35 U.S.C. §119(e) to provisional application No. 61/311,513 titled "Boron, Bismuth co-doping of Gallium Arsenide and Other Compounds for Photonic and Heterojunction Bipolar Transistor Devices," filed on Mar. 8, 2010, which is hereby incorporated herein by reference in its entirety.

CONTRACTUAL ORIGIN

The United States Government has rights in this invention under Contract No. DE-AC36-08GO28308 between the United States Department of Energy and the Alliance for Sustainable Energy, LLC, manager and operator of the National Renewable Energy Laboratory.

TECHNICAL FIELD

Aspects of the present disclosure relate generally to the formulation and fabrication of doped semiconductor materials and devices.

BACKGROUND

It is possible to formulate and fabricate semiconductor materials by doping crystal lattice materials such that an amount of an element belonging to one column on the periodic table of the elements, (e.g., an element having one number of conduction or outer shell electrons), is replaced with an element from a different column or group on the periodic table, (e.g., an element having a different number of conduction or outer shell electrons, usually one column or group removed such that it has one more or one fewer outer shell electrons). It is also possible to use various alloys to form the semiconductor material, (i.e., substitutions on lattice sites by elements from the same column (or group) in the periodic table), to obtain particular semiconductor characteristics as needed or desired. For example, particular band gaps, crystal lattice constants, mobility, and the like may be obtained.

U.S. Pat. No. 6,815,736 to Mascarenhas (Mascarenhas), builds on the teachings discussed above, describing a system for isoelectronic co-doping of semiconductor compounds and alloys with deep acceptors and deep donors to decrease bandgap, to increase concentration of the dopant constituents in the resulting alloys, and to increase carrier mobility and lifetimes. Group III-V compounds and alloys, such as GaAs and GaP, are isoelectronically co-doped with, N and Bi, to customize solar cells, thermophotovoltaic cells, light emitting diodes, photodetectors, and lasers on GaP, InP, GaAs, Ge, and Si substrates. The GaAs:N:Bi compound discussed in Mascarenhas has great promise; however, difficulties have been recognized in practical implementations. For example, Nitrogen acting as a deep acceptor, introduces impurity bands in the vicinity of the conduction band of GaAs, which degrades the electron transport in this band. Thus, the mobility of electrons may be lower than optimal. At low N and Bi doping levels (typically <1%), the statistical probability for the occurrence of N—Bi pairs is very low. Therefore, the benefits attributed to charge and size balancing of the N and Bi isoelectronic impurities using co-doping that were anticipated in Mascarenhas are difficult to attain in practice.

Similarly to Mascarenhas, but in the context of transistors, U.S. Pat. No. 6,936,871 to Hase (Hase), discusses a heterojunction bipolar transistor (HBT) employing a Group III-V compound semiconductor having Bi added thereto used for a base layer of a GaAs-based or InP-based HBT. For example, Hase describes a GaAs-based HBT formed by various layers, including a GaAsBi:N base. However, Hase does not appear to recognize that the proposed emitter base junction formed at a boundary between the GaAs emitter and GaAsBi:N base may have undesirable electrical transport characteristics. To wit, co-doping of GaAs with Bi and N will have the beneficial effect of a Bi doping induced valence band offset (and thus a desirable barrier for blocking back injection of holes from the base to emitter), and the counterbalancing of the concomitant Bi doping induced lattice mismatch, by the N co-doping; however, Hase does not recognize that the impurity bands in the vicinity of the conduction band, that are inherently associated with N doping, may not be mitigated by the Bi co-doping for the reasons discussed above. Hence, electron transport in the HBT structure of Hase including GaAsBi:N, will not be optimal.

SUMMARY

The following embodiments and aspects there of are described and illustrated in conjunction with systems, tools, and methods which are meant to be exemplary and illustrative, not limiting in scope. In various embodiments, one or more of the above-described problems have been reduced or eliminated, while other embodiments are directed to other improvements.

Accordingly, aspects of this disclosure involve isoelectronic co-doping GaAs with Bismuth (Bi) and Boron (B) in a manner that makes it lattice matched to GaAs without introducing significant impurity levels at the conduction band. hence, aspects of the disclosure provide for increases in the electronic device quality of the alloy enough to make it useful, as an HBT material.

By way of example and not limitation, an exemplary embodiment includes a monolithic, quadruple junction solar cell comprising a first cell comprising Ge with a bandgap of about 0.67 eV and a second cell comprising GaAs that is isoelectronically co-doped with an acceptor element and a deep donor element to have an effective bandgap of about 1.05 eV on the first cell. The embodiment also includes a third cell comprising GaAs with a bandgap of about 1.42 eV on the second cell and a fourth cell comprising InGaP with a bandgap of about 1.90 eV on the third cell.

Another exemplary embodiment, by way of example and not limitation, includes a two-junction tandem solar cell comprising a monolithic first cell comprising a substrate with a bandgap of about 1.1 eV and a first charge-doped p-n junction between a GaP window layer and a particular BSR layer of GaP:B:Bi. The two-junction tandem solar cell also includes a monolithic second cell adjacent to the first cell, the second cell comprising GaP that is isoelectronically co-doped with a deep acceptor element and a deep donor element to have an effective bandgap of about 1.75 eV and a second charge-doped p-n junction.

Other embodiments, by way of example and not limitation, include a heterojunction bipolar transistor (HBT) device that includes an emitter layer, a base layer having at least one Group III-V compound co-doped with Bi and B, and a collector layer.

The exemplary aspect of this disclosure includes semiconductor devices, such as HBTs. In addition to the exemplary aspects and embodiments described above, further aspects and embodiments will become apparent by reference to the drawings and by study of the following descriptions.

BRIEF DESCRIPTION OF THE DRAWINGS

Exemplary embodiments are illustrated in referenced figures of the drawings. It is intended that the embodiments and figures disclosed herein are to be considered illustrative rather than limiting.

DETAILED DESCRIPTION

Figure 1:
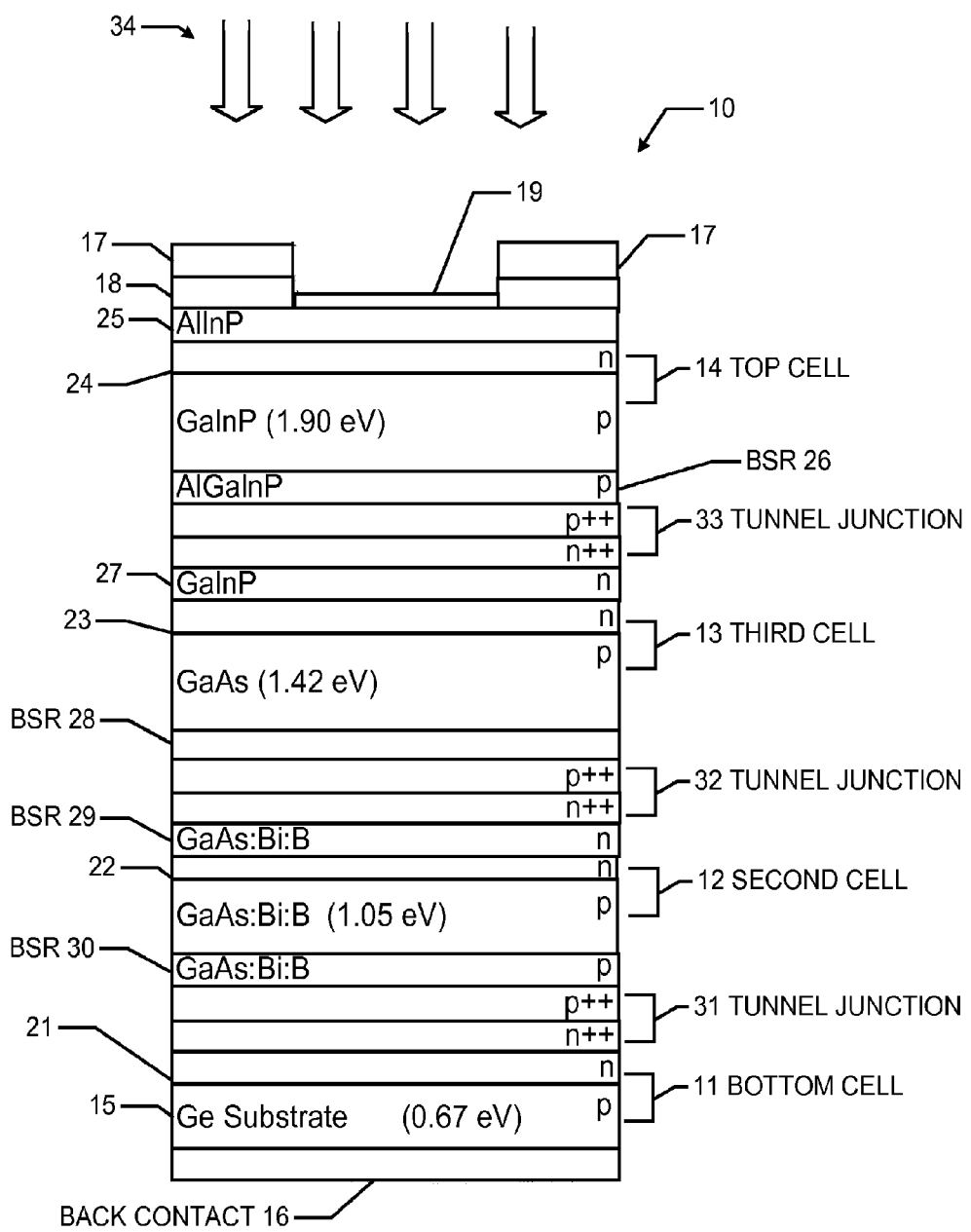
FIG. 1 is a diagrammatic cross-sectional view of a monolithic, quadruple junction, solar cell including a cell of co-doped GaAs:Bi:B.

It has been previously demonstrated that the addition of N to GaAs by doping can reduce the bandgap of semiconductors. For example, the giant conduction band bowing observed in $GaAs_{1-x}N_x$ by Weyers et al., "Red Shift of Photoluminescence and Absorption in Dilute GaAsN Alloy Layers," Jpn. J. Appl. Physics 31 (1992) p. L853, appeared to demonstrate that the addition of N to GaAs could reduce the bandgap of GaAs significantly. The subsequent fabrication of the $Ga_{0.92}In_{0.08}N_{0.3}As_{0.97}$ alloy by Kondow et al., "Extremely Large N Content (up to 10%) in GaNAs Grown by Gas-source Molecular Beam Epitaxy," J Cryst. Growth 164 (1996) pp. 175, utilized that concept to fabricate a semiconductor material with the desired 1.0 eV bandgap. The present disclosure and devices described herein are provided in view of the following observations: (i) the N in the alloy creates isoelectronic traps, which have been defeated all attempts to utilize such giant bowing of the conduction band, and (ii) the N in the GaAs does not just induce the bowing of the conduction band of GaAs, but the N impurities also participate directly in the formation of the conduction band via the formation of a deep acceptor N impurity band.

In recent years, dilute bismide alloys, (e.g. $GaAs_{1-x}Bi_x$) have attracted a lot of interest due to their unusual properties such as giant band-gap bowing and spin-orbit bowing and their potential technological applications in high-efficiency solar cells, heterojunction bipolar transistors (HBTs), spintronics, and near-infrared devices. Incorporating Bi results in the formation of several trap levels above the valence band, which is attributed to Bi—Bi pair states, and does not degrade electron mobility in GaAsB, as shown BY Kini et al., "Effect of Bi alloying on the hole transport in the dilute bismide alloy $GaAs_{1-x}Bi_x$," Phys. Rev. B83, 075307 (2011), which is hereby incorporated herein by reference in its entirety.

The present disclosure makes note of the following discoveries. First, isoelectronic doping of GaAs with Bi creates deep donor states. Second, the effect of such deep donors on the valence band mirrors the effect of N on the conduction band. It induces a giant bowing of the valence band of GaAs via the formation of a deep donor Bi impurity band. Third, isoelectronic doping of GaAs with Bi alone leads to a lowering of the band gap without significant degradation of the electron mobility in the conduction band. Fourth, isoelectronic co-doping of GaAs with both Bi and B virtually eliminates the poor conduction band electron mobilities and hopping-like transport characteristics, which are inherent in GaAs doped only with N. Fifth, B doping of GaAs has almost no effect on the bandgap or mobilities in GaAs solar cell. Boron is practically electronically inert in GaAs. Sixth, the small size of B serves to counterbalance the large size of Bi when both are co-doped into GaAs.

Aspects of the present disclosure are applicable to the teachings of U.S. Pat. No. 6,815,736 titled "Isoelectronic Co-Doping" to Mascarenhas, issued on Nov. 9, 2009, which is hereby incorporated herein by reference in its entirety. The present disclosure is also applicable to the teachings of U.S. Pat. No. 6,936,871 titled "Heterojunction Bipolar Transistor with a Base layer that Contains Bismuth" to Hase, issued on Aug. 30, 2005, which is hereby incorporated herein by reference in its entirety. Namely, the present disclosure involves the substitution of B for N in the GaAs, and InGaAs layers and the substitution of B for N in the GaAs and InGaP heterojunction bipolar transistor structures of Hase. Thus, boron is co-doped with bismuth, rather than nitrogen being co-doped with bismuth, in the various relevant structures disclosed in Mascarenhas and Hase. By way of example and not limitation, in place of nitrogen, boron is co-doped with bismuth to form GaAs:Bi:B and InGaP:Bi:B based heterojunction bipolar transistor structures.

By way of example, and not limitation a high efficiency, monolithic, quadruple junction, solar cell 10, as shown in FIG. 1, may be constructed according to the present disclosure. An active, light-absorbing cell 12 comprising a dilute alloy of $Ga_{1-y}As_{1-x}Bi_xB_y$ (sometimes abbreviated as GaAs:Bi:B) with a bandgap of about 1.05 eV is positioned between a Ge Cell 11 (bandgap of 0.67 eV) and a GaAs cell 13 (bandgap of 1.42 eV) in the monolithic, quadruple junction, solar cell 10, which also has a InGaP cell 14 (bandgap of 1.90 eV) overlaying the GaAs cell 13 and a Ge substrate 15, which is doped to provide a p-n junction 21 as the bottom Ge cell 11. The solar cell 10 also has a bottom contact layer 16 and top grid 17 to facilitate the electrical connection of the cell 10 within a circuit (not shown). Other features, such as an anti-reflection (A.R.) coating 19, window layer 25 to passivate the surface, contact layer 18 to facilitate ohmic contacts, and back surface reflectors (BSR) 26, 27, 28, 29, 30, are shown. The BSR layers 26, 27, 28, 29, 30 are designed to be lattice matched to the regions they surround. In various aspects, the BSR layers 26, 27, 28, 29, 30 have higher bandgaps than the surrounding regions.

When solar radiation 34 irradiates the solar cell 10, the higher energy, shorter wavelength portion of the solar spectrum (e.g., wave-lengths in a range of about 652 nm and below) is absorbed and converted to electric energy substantially in the top (fourth) cell 14 of InGaP. The lower energy, longer wavelength solar radiation is transmitted into the next (third) cell 13 of GaAs. The next to highest energy range of solar radiation (e.g., wavelengths of about 873 nm to 652 nm) is then absorbed and converted to electric energy substantially in the GaAs third cell 13, which also transmits lower energy solar radiation to the second cell 12 composed of GaAs:Bi:B. Solar radiation in the range of about 1180 nm to 873 nm is absorbed and converted to electric energy substantially in this second cell 12, while the remaining unabsorbed, lower energy radiation is transmitted to the first or bottom cell 11 composed of Ge. The bottom cell 11 absorbs and converts solar radiation in a range of about 1850 nm to 1180 nm to electric energy. Therefore, a monolithic, quadruple junction, solar cell 10 constructed as described above can absorb and convert enough of the solar radiation spectrum to electric energy to approach an overall cell efficiency of 40% AM1.

The charge doping of each cell 11, 12, 13, 14 to fabricate all the p-n junctions may be accomplished by any suitable means, including adding impurity or dopant atoms selected from higher or lower groups on the periodic table of the elements. By way of example and not limitation, the GaAs:Bi:B cell 12 can be p-type doped with acceptor atoms from Group II (e.g., Zn or Cd) and n-type doped with donor atoms from Group VI (e.g., S, Se, or Te) to form the p-n junction 22 of the GaAs:Bi:B cell 12, as well as the GaAs:Bi:B tunnel junction 32 between the second cell 12 and the third cell 13.

The cell p-n junction 23 in the third cell 13 of GaAs and the GaAs tunnel junction 33 between the third cell 13 and the fourth or top cell 14 can also be fabricated by charged doping with Group VI and Group II atoms, respectively.

Since Ge is a Group IV element, it can be charged doped with acceptor atoms from Group III elements and donors from Group V elements to form the p-type and n-type semiconductor materials, respectively, for the p-n junction 21 in the first cell 11 and for the tunnel junction 31 between the bottom cell 11 and the second cell 12. The Ge substrate 15 can also be p-type doped with Group III acceptor atoms.

This disclosure, however, is not limited to the particular solar cell 10 example structure described above. As discussed below, the principles of this disclosure can be used with other alloys and compounds and other semiconductor devices, including solar cells, having n-p and/or p-n junctions.

Figure 2:
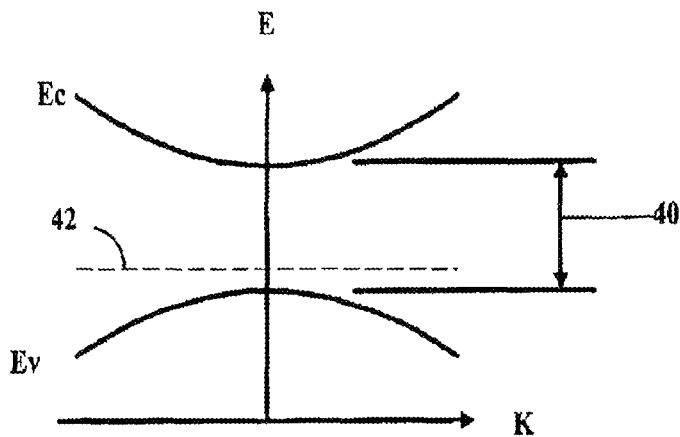
FIG. 2 is a graphical illustration of a prior art direct bandgap with an acceptor dopand energy level.
Figure 3:
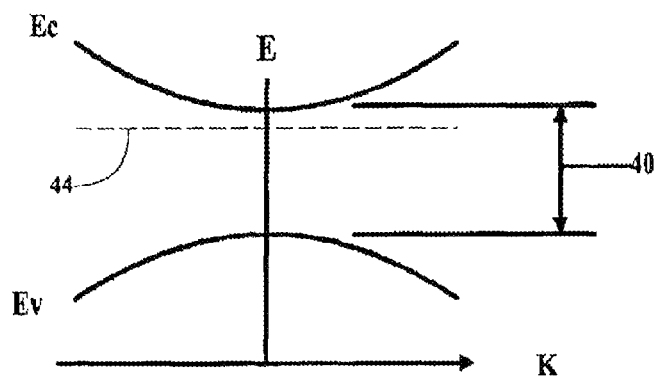
FIG. 3 is a graphical illustration of a prior art direct bandgap with a donor dopand energy level.
Figure 4:
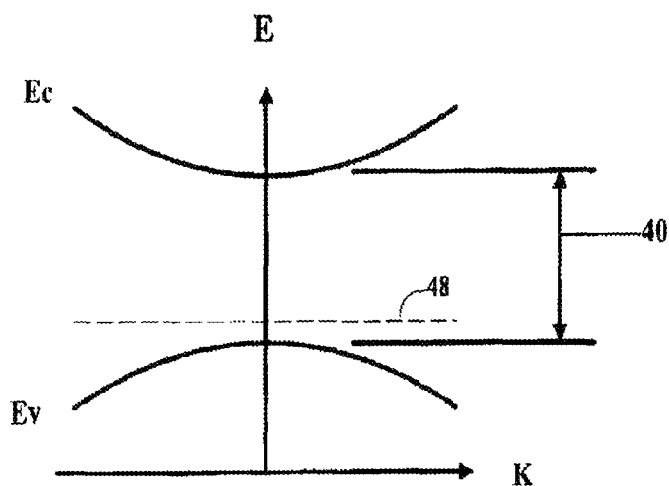
FIG. 4 is a graphical representation of a bandgap 40 of a semiconductor material that is co-doped with Boron and deep donor 48 (Bismith) impurities.

Reference is now made to FIGS. 2, 3, and 4, wherein FIGS. 2 and 3 illustrate dopant energy levels of conventional charged dopant acceptors and donors in a semiconductor material. In FIG. 2, the conduction band energy $E_c$ and valence band energy $E_v$ are illustrated for a semiconductor material with a direct bandgap, i.e., wherein the minimum $E_c$ and the maximum $E_v$ both occur where the momentum vector k=0. In other words, an electron crossing the bandgap 40 has only to change its energy, but not its momentum, as opposed to an indirect bandgap material in which such an electron crossing the bandgap would also have to change its momentum. A conventional p-type charged dopant is an acceptor type atom, which is usually of one group to the left of a host element on the periodic table of the elements, i.e., one fewer electron in the outer energy shell. Such a conventional, charged acceptor dopant band 42 is illustrated in FIG. 2, which shows that the conventional, charged acceptor dopand energy level is closer to the valence energy band $E_v$ than to the conduction energy band $E_c$. A conventional, charged donor dopant band 44, as shown in FIG. 3, is closer to the conduction energy band $E_c$ than to the valence energy band $E_v$.

In contrast, as illustrated in FIG. 4, the isoelectronic dopant level 48 created by the Bi in GaAs:B:Bi is a "deep donor", i.e., a donor with a dopant level 48 that is farther away from the conduction energy band $E_c$ and closer to the valence energy band $E_v$. B isoelectronic impurities, on the other hand, typically do not form bound states (or deep impurity, or trap states) in GaAs. Therefore, GaAs:B:Bi can be lattice matched to GaAs.

An isoelectronic deep donor element or dopant, for purposes of this disclosure is an isoelectronic dopant that is less electronegative than the host lattice element for which it substitutes. An isoelectronic deep donor element or dopant may behave as a hole trap and have dopant energy levels which are closer to the valence energy band $E_v$ of the host semiconductor alloy than to the conduction energy band $E_c$ of the host semiconductor alloy.

The impurity levels introduced by normally used charged acceptors, such as impurity level 42 illustrated in FIG. 2, are located typically a few meV, e.g., about 20 meV, above the valence band edge $E_v$. Likewise, impurity levels introduced by normally used charged donors, such as impurity level 44 illustrated in FIG. 3, are typically a few meV below the conductor band edge $E_c$. If the depth of these levels introduced by impurities were to be greater than the room temperature Boltzmann energy kT=26 meV, then most of the dopants would not be ionized at room temperature, thus would not behave as acceptors or donors. Impurity levels induced by charged acceptors or donors that are much deeper than 26 meV are referred to as deep levels.

An impurity level 48 induced by a hole trap, such as Bi, is near the valence band $E_v$ rather than being near the conduction band $E_c$. Therefore, an isoelectronic dopant, such as Bi, which forms a hole trap and induces an impurity level 48 that is closer to the valence band $E_v$ than to the conduction band $E_c$ is referred to as in isoelectronic deep donor.

Also, it is known in the art that In can be added to the cation sublattice or As can be added to the anion sublattice of Group III-V semiconductor compounds or alloys to adjust lattice size. Such addition of In and/or As, usually not more than about 5 atomic percent (at. %) of the respective anion or cation sublattice, can be used in any of the isoelectronically co-doped Group III-V compounds or alloys described above where adjustment of lattice size is needed or desired. For example, such additions may be made to accommodate independent optimization of the isoelectronic co-dopants while maintaining or achieving desired lattice matching constraints. Therefore, the addition of In and/or As to any of the isoelectronically co-doped Group III-V compounds or alloys as described above, are considered part of this disclosure. It would be unnecessarily cumbersome to list all such variations in the description or claims for each embodiment. Consequently, for convenience in describing and claiming this disclosure, references herein to GaAs:B:Bi and GaP:B:Bi are considered to also cover such variations as GaAs:B:Bi:In, and references herein to GaP:B:Bi are considered to also cover such variations as GaP:B:Bi:In and GaP:B:Bi:As.

Figure 5:
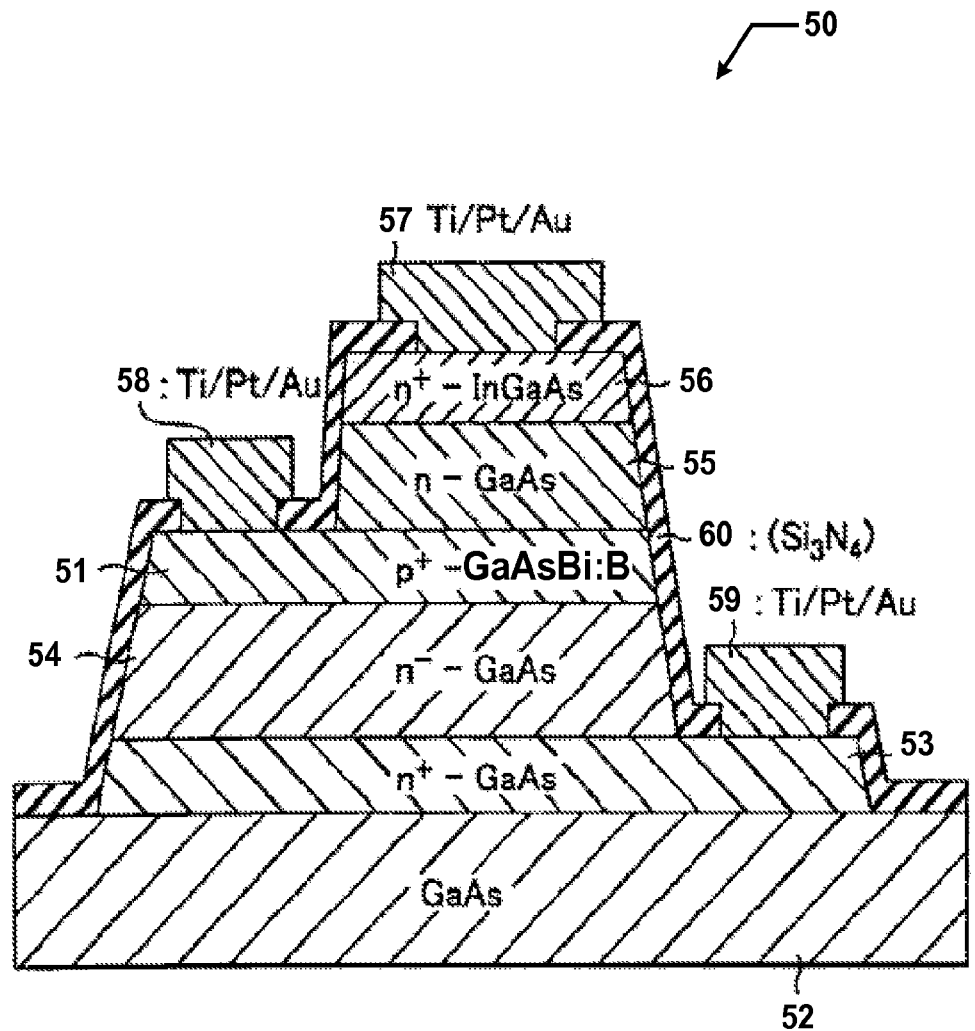
FIG. 5 is a diagrammatic sectional view of a heterojunction bipolar transistor.

FIG. 5 depicts an HBT semiconductor device 50 according to an aspect of the present disclosure, wherein GaAs:Bi:B is used for a base layer 51. The HBT device 50 includes a substrate 52, a sub-collector layer 53 composed of $n^+$-GaAs, and a collector layer 54 composed of $n^-$GaAs. the device 50 also includes an emitter layer 55 made of n-GaAs and a cap layer 56 made of $n^+$-InGaAs. In various aspects, the various layer are successively stacked on the substrate 52. In one aspect, the substrate 52 is composed of a single crystal of GaAs.

An emitter electrode 57 is formed on the cap layer 56. In one aspect, portions of the cap layers are removed to form a mesa structure for functioning as a base contact.

In other aspects, a base electrode 58 is in direct contact with the base layer 51. A mesa structure may also be formed of Ti, Pt, Au, or combinations and alloys thereof. In other aspects, other suitable material may be used. In another aspect, the surface of the semiconductor device that is not in contact with any of the electrodes is covered with an insulating film 60. In one aspect, the insulating film 60 is composed of $Si_3N_4$. In other aspects, other suitable insulating components may be used.

Figure 6:
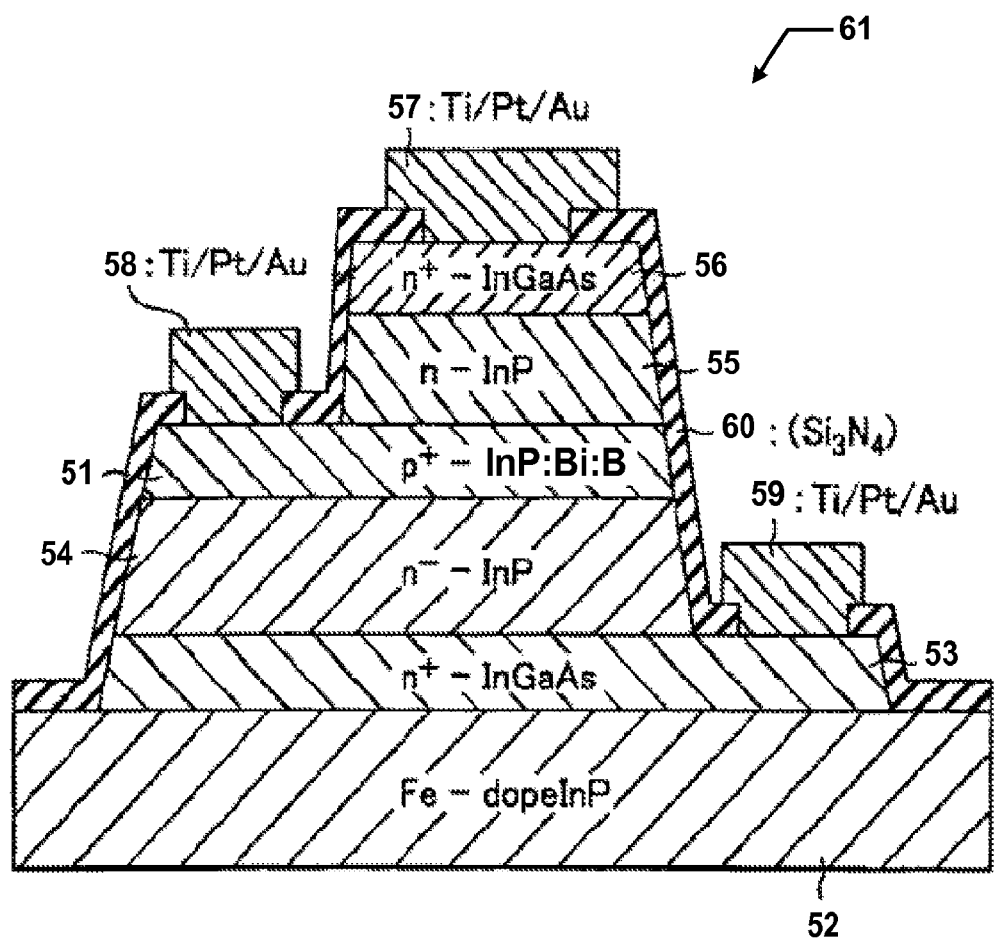
FIG. 6 is a diagrammatic sectional view of a heterojunction bipolar transistor according to this disclosure.

FIG. 6 depicts another HBT semiconductor device 61 according to another aspect of the present disclosure. The HBT device 61 is similar to the HBT device 50, however, in this aspect, the base layer 51 is composed of InP:Bi, while the substrate 52 is composed of InP, the emitter layer 55 is composed of n-InP, and the collector layer 54 is composed of n⁻-InP. As discussed above, other suitable compounds and alloys may e co-doped with Bi and B to produce other HBT semiconductor devices similar to the devices 50 and 61.

Unless otherwise stated, the word "about," when used with a bandgap means within 0.2 eV, when used with at. % means within 1.0 at. %, when used with wavelength means within 0.1 μm. Also, when an atomic species in the nomenclature of a semiconductor compound or alloy is separated by a colon from other atomic species, e.g., the B and Bi in GaAs:B:Bi, such atomic species separated by a colon or considered to comprise a very small percentage of the alloy or compound, i.e., about 6 at. % or less, and such nomenclature is sometimes used herein for convenience, but not necessarily for limitation.

Since numerous modifications and combinations of the above method and embodiments will readily occur to persons skilled in the art, it is not desired to limit the disclosure to the exact construction and process shown and described above. Accordingly, resort may be made to all suitable modifications and equivalents that fall within the scope of the disclosure as defined by the claims which follow. The words "comprise," "comprises," "comprising," "include," "including," and "includes" when used in this specification and in the following claims are intended to specify the presence of stated features, structures, or steps, but they do not preclude the presence or addition of one or more other features, structures, steps, or groups thereof.

While a number of exemplary aspects and embodiments have been discussed above, those of skill in the art will recognize certain modifications, permutations, additions, and sub combinations thereof. It is therefore intended that the following appended claims and claims hereafter introduced are interpreted to include all such modifications, permutations, additions, and sub-combinations as are within their true spirit and scope.

What is claimed is:

1. A monolithic, quadruple junction solar cell, comprising:
    a first cell comprising Ge with a bandgap of about 0.67 eV;
    a second cell comprising GaAs that is isoelectronically co-doped with a Group III acceptor element and a Group V donor element, to have a bandgap of about 1.05 eV on the first cell, wherein the Group III acceptor element is B and the Group V donor element is Bi to form a GaAs:Bi:B crystal lattice;
    a third cell comprising GaAs with a bandgap of about 1.42 eV on the second cell; and
    a fourth cell comprising InGaP with a bandgap of about 1.90 eV on the third cell.

2. The monolithic, quadruple junction solar cell of claim 1, wherein the Ge first cell has a charge-doped p-n junction, the isoelectronically co-doped GaAs second cell has a charge-doped p-n junction, the GaAs third cell has a charge-doped p-n junction, and the InGaP fourth cell has a charge-doped p-n junction.

3. The monolithic, quadruple junction solar cell of claim 2, further comprising:
    a $p^{++}$-$n^{++}$ doped Ge tunnel junction between the first cell and the second cell;
    a $p^{++}$-$n^{++}$ doped tunnel junction of isoelectronically co-doped GaAs between the second cell and the third cell; and
    a $p^{++}$-$n^{++}$ doped GaAs tunnel junction between the third cell and the fourth cell.

4. The monolithic, quadruple junction solar cell of claim 3, wherein the p-n junctions comprising the second and third cells are sandwiched between one or more BSR layers, each of the one or more BSR layers having a higher bandgap than the respective p-n junction located therebetween.

5. The monolithic, quadruple junction solar cell of claim 3, wherein the p-n junction of the fourth cell is sandwiched between an n-type AlInP window layer and a BSR layer.

6. The monolithic, quadruple junction solar cell of claim 3, further comprising a first conductive contact on the substrate and a second conductive contact on the fourth cell.

7. The monolithic, quadruple junction solar cell of claim 1 wherein a content of the B in the GaAs:B:Bi crystal lattice is about 2 atomic percent B and a content of the Bi in the GaAs:B:Bi crystal lattice is about 3.8 atomic percent Bi.

8. The solar cell of claim 1, wherein the Group III acceptor element is not a deep acceptor element.

9. The solar cell of claim 1, wherein the Group V donor element is a deep donor element.

10. A solar cell comprising:
    GaAs that is isoelectronically co-doped with a Group III acceptor element and a Group V donor element, to have a bandgap of about 1.05 eV, wherein the Group III acceptor element is B and the Group V donor element is Bi to form a GaAs:Bi:B crystal lattice.

* * * * *